United States Patent [19]

Zander et al.

[11] 4,025,899

[45] May 24, 1977

[54] CIRCUIT ARRANGEMENT FOR DATA INPUT AND OUTPUT IN DATA PROCESSING DEVICES

[75] Inventors: Michael Zander, Braunschweig; Rudolf Schicht, Salzgitter, both of Germany

[73] Assignee: Olympia Werke AG, Wilhelmshaven, Germany

[22] Filed: Dec. 18, 1975

[21] Appl. No.: 642,116

[30] Foreign Application Priority Data

Dec. 20, 1974 Germany .................. 2460486

[52] U.S. Cl. .................. 340/147 R; 340/365 S; 340/336

[51] Int. Cl.² .................. G06F 3/02; G02F 1/18

[58] Field of Search ....... 340/166 R, 147 R, 365 R, 340/365 S, 336, 324 R

[56] References Cited

UNITED STATES PATENTS

| | | | |
|---|---|---|---|
| 3,483,553 | 12/1969 | Blankenbaker | 178/17 R |
| 3,834,616 | 9/1974 | Washizuka et al. | 340/365 S |
| 3,922,668 | 11/1975 | Kishimoto et al. | 340/336 |

Primary Examiner—Donald J. Yusko
Attorney, Agent, or Firm—Spencer & Kaye

[57] ABSTRACT

A circuit arrangement for data processing devices including an input keyboard with keyboard contacts disposed at the points of intersection of a conductor matrix and a multiposition data output device. The data is fed into the data processing device in such a manner that signals furnished cyclically from an electronic control circuit to a series of outputs are fed as control signals to the respective positions of the data output device and, via circuit branches, as interrogation signals to the respective row lines of the keyboard matrix which has its column lines connected to inputs of an electronic decoder for evaluating signals received via closed keyboard contacts. A transistor is disposed at each of the branch points with its emitter-collector path connected between the respective output of the control circuit and the associated position of the data output device. The base of each of the transistors is connected with the associated row line of the keyboard matrix.

5 Claims, 2 Drawing Figures

CIRCUIT ARRANGEMENT FOR DATA INPUT AND OUTPUT IN DATA PROCESSING DEVICES

BACKGROUND OF THE INVENTION

The present invention relates to an improved circuit arrangement for the data input and output of a data processing device.

In the semiconductor art, particularly with semiconductor devices constructed according to the MOS technique, it is desired to accommodate all circuit elements in as few highly integrated semiconductor circuit chips as possible. However, due to the geometrical dimensions of such highly integrated semiconductor circuit chips, there exists the problem that since the number of contacts which can be accommodated on such a chip is extrememly limited, this number of contacts must be sufficient for the intended purposes.

One possibility of reducing the number of contacts required is to conduct the data input signals coming from a keyboard and the output signals travelling to a display device or a printer, at least to a major part, to the same contact terminals on the highly integrated circuit chips. For this purpose the control signals coming from the circuit, which are fed via amplifier circuits to the individual positions of the output device, are fed via branch circuits to one side of the keyboard contacts of the input keyboard and the other side of the keyboard contacts is returned to the circuit. The keys of the input keyboard are then — likewise in order to save contacts — disposed at the points of intersection of a conductor matrix. If now the highly integrated circuit addresses, in succession, the individual positions of the output device, the rows of the keyboard matrix also receive, in succession, an interrogation signal via the branch circuits. If a keyboard contact is closed, the interrogation signal is returned via the associated column line to the circuit as an input signal. In a decoding circuit, which is part of the circuit, the input value is then detected from the interrogation signal and the input signal. Since the keys of each column line are interconnected decoupling circuits must be provided in addition so that when a plurality of key contacts are closed simultaneously there will be no cross-talk to adjacent positions of the output device. A device as described above is disclosed in commonly assigned U.S. Pat. application Ser. No. 535,088, filed Dec. 20, 1974, by Gerald Weber and Jurgen Sorgenfrei. A similar device is disclosed in U.S. Pat. No. 3,855,577, issued Dec. 17, 1974 to J.L. Vandierendonck. Another similar device is disclosed in U.S. Pat. No. 3,879,713, issued Apr. 22, 1975 to H. Bettin et al.

SUMMARY OF THE INVENTION

It is the object of the present invention to provide a circuit arrangement of the above described type with which contacts can be doubly utilized for input and output signals without requiring any additional circuitry.

The above object is achieved according to the present invention in that in a circuit arrangement for a data processing device including: an input keyboard with keyboard contacts disposed at the points of intersection of a conductor matrix, a multiposition data output device, an electronic control circuit means having a plurality of outputs, each connected to a separate position of the data output device for controlling same, for sequentially providing a control signal at each of its outputs, means connected to respective ones of the otuputs, and responsive to the control signals, for applying an interrogation signal to a respective one of the row lines of the keyboard conductor matrix, and a decoder means connected to the column lines of the conductor matrix for evaluating the signals received via the column lines as a result of closed keyboard contacts as the input data for the data processing device; a plurality of transistors are provided with each transistor being associated with one of the outputs and having its emitter-collector path connected between the associated output and the associated position of the data output device, and its base connected to the associated row line of the conductor matrix.

Due to the circuit configuration of the invention, additional circuitry for decoupling the keys or keyboard contacts from one another will not be necessary. The interrogation signal path is separated from the control signal path for the output positions in a switch-like manner and whenever a control signal is applied to the control signal path, this separation of the paths is terminated. In this way only one particular interrogation line of the keyboard is connected with the circuitry of the data processing arrangement, and in particular the decoder, at any one time.

According to the preferred embodiment of the invention, the data output device is a plurality of tubes preferably multiple number display tubes. The additional advantage of this embodiment over the known control circuits for number display tubes is that only one transistor is required in the grid circuits representing the digits of the output device as well as in the anode circuits representing the segments of the number display tubes. In this case the base-emitter diodes of the grid transistors are used to decouple the keyboard contacts.

DETAILED DESCRIPTION OF THE PREFERRED EMBODIMENT

Figure 1:
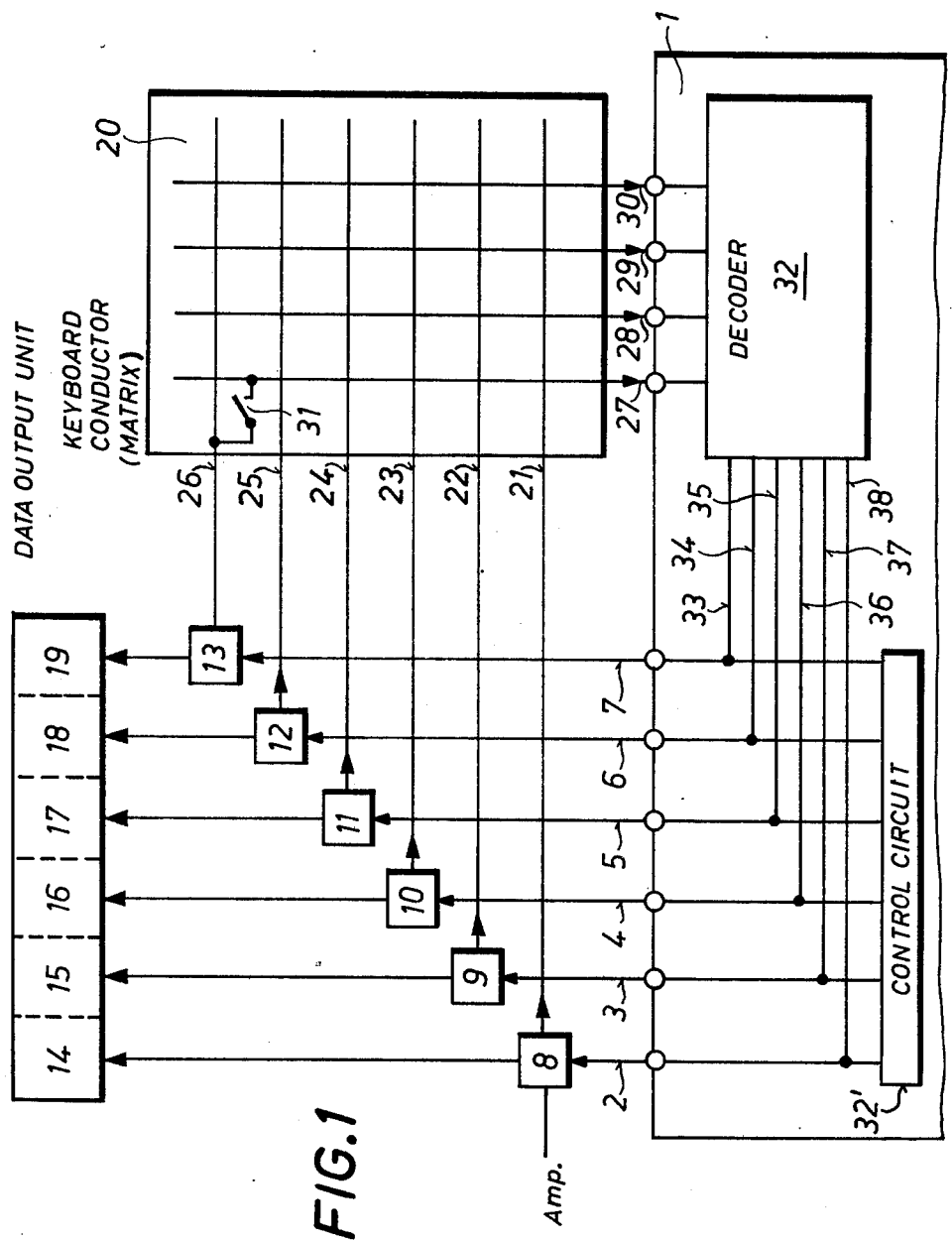
FIG. 1 is a block circuit diagram of the invention.

Referring now to FIG. 1, a highly integrated circuit 1, e.g. an MOS chip, is shown schematically in section. Connected to the output terminals of the circuit 1 is a plurality of output lines 2–7. These lines 2–7 lead to amplifier circuits 8–13 respectively and from there to the individual positions 14–19 respectively of an output unit which may be, for example, a printer or a display device. Also connected to the amplifier circuits 8–13 are lines 21–26 respectively of a keyboard conductor matrix 20. Each point of intersection of the row lines 21–26 with the column lines 27–30 of the keyboard conductor matrix 20 is provided with a key contact so that when the contact is closed a conductive connection exists between the associated row and column lines. One such keyboard contact 31 is shown at the point of intersection of row line 26 and column line 27 in FIG. 1, whereas for reasons of clarity the keyboard contacts at the other points of intersection are shown. Column lines 27–30 are again returned to the highly integrated circuit chip 1 via input terminals and fed to a decoder 32, which also is connected to each of the output lines 2–7 via lines 33–38.

During operation of this device, positions 14–19 of the data output unit are addressed continuously and in sequence by the control circuit 32' of the chip which is connected to the output lines 2–7. Since the control signal sequentially applied to lines 2–7 is not sufficient to excite the output elements in the respective positions 14–19, it must be amplified in the amplifier circuits 8–13 respectively. During this amplification process, one of the lines 2–7, the output of the associated amplifier circuit 8–13 respectively which is connected to the addressed position of the output data unit, and the associated row line 21–26 respectively of the keyboard matrix are always conductively interconnected, while when there is no control signal in lines 2–7, the associated row line 21–26 respectively of keyboard matrix 20 is not conductively connected with the output of the associated amplifier circuit 8–17 respectively.

Thus, if for example a control signal is given from the circuit of chip 1 to output line 7, this signal is amplified in amplifier circuit 13 and position 19 of the output unit is addressed. At the same time an interrogation signal, which is derived from the control signal in amplifier 13, reaches key contact 31 via row line 26 and, if key contact 31 is closed this signal is fed via column line 27 back to the circuit of chip 1. In the decoder 32, which is part of the circuit of chip 1, a signal which has been internally derived from the control signal and provided via line 33 is decoded with the signal from row line 27, and thus the value fed in via key 31 is recognized.

If in addition to key contact 31, other key contacts which cooperate with the same column line 27 but with different row lines 21–25 were closed at the time a control signal was present on output line 7, and accordingly an interrogation signal was present on row line 26, no action is taken with respect to the other associated positions of the output unit, nor will such additionally closed key contacts provide any signal on column line 27, since no conductive connection exists in the amplifier circuits 8–12 of the remaining control lines 2–6. However any additional closed key contacts which cooperate with row line 26 will produce input signals to the decoder 32 via the associated one of the column lines 28–30.

Once position 19 of the data output device has been addressed via line 7, the remaining positions are then addressed in rapid succession, i.e., position 18 is addressed via line 6, position 17 via line 5, etc. Each time one of the lines 2–7 is addressed, a signal is transmitted simultaneously to decoder 32 via the respective associated line 33–38.

Figure 2:
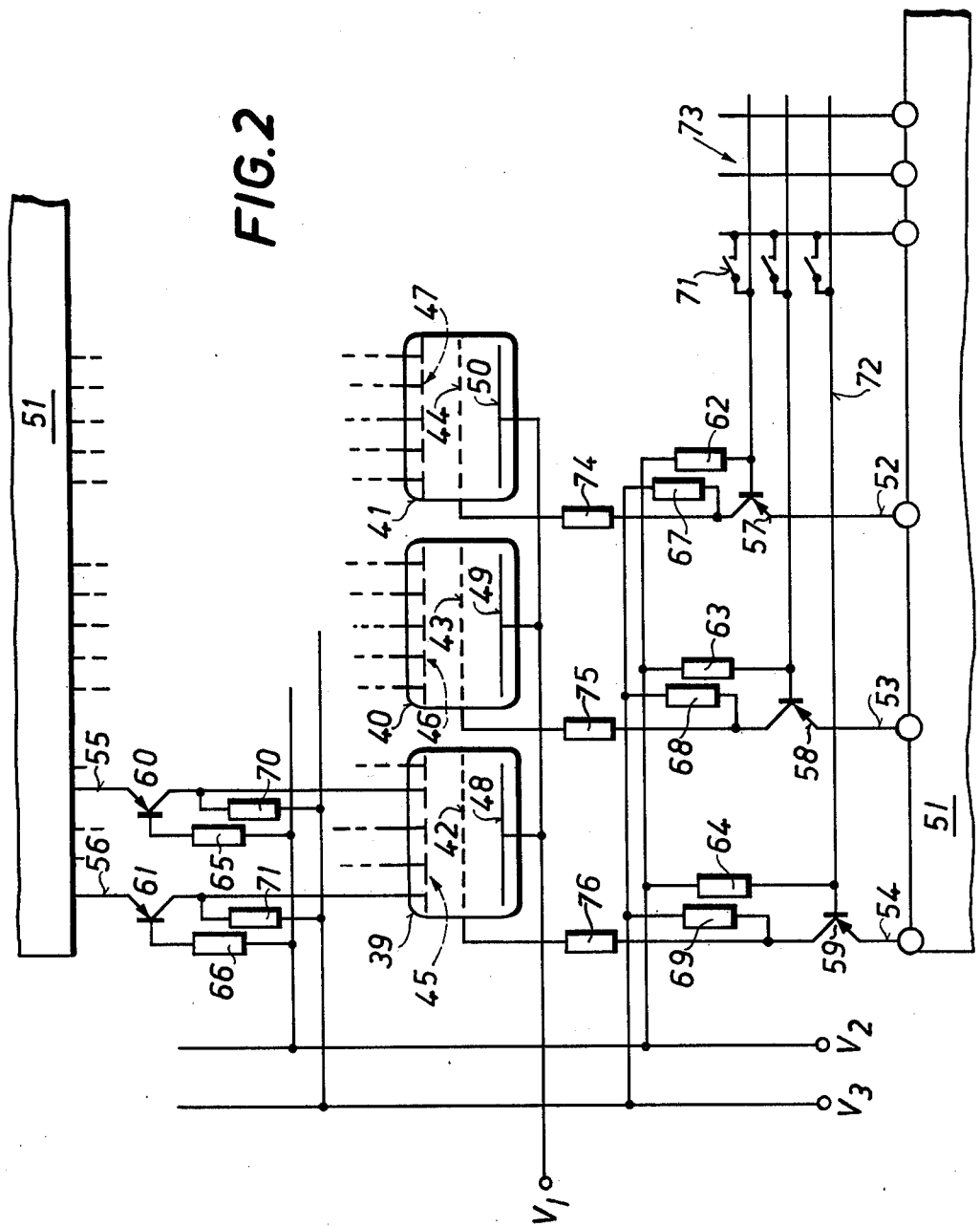
FIG. 2 is a schematic circuit diagram of the preferred embodiment of the invention utilizing number display tubes as the data output device.

FIG. 2 shows the details of the circuit arrangement of FIG. 1 for an embodiment including a plurality of number display tubes 39–41 as the data output device, with each tube 39–41 corresponding to one output position. In this embodiment the tubes 39–41 corresponding to the positions of the output device are controlled via their grids 42–44 respectively while the individual segments of tubes 39–41 which represent numbers are formed by the respective groups of anodes 45–47. Each of the tubes 39–41 is provided with a cathode 48–50 respectively which are suppled with a d.c. voltage of, for example, -40 volts from a first d.c. voltage source $V_1$. The number display tubes 39–41 in this exemplary embodiment are assumed to require an operating voltage of 50 volts.

In integrated circuit 51, the output control lines 52, 53, 54 are supplied in succession with control signals, here assumed to be at a voltage of 0 volt. Output lines 52–54 of integrated circuit 51 are in conductive connection with the emitters of transistors 57–59 respectively which are employed as single stage amplifiers. The collectors of transistors 57–59 are connected via resistors 74–76 respectively to the grids 44, 43, 42 of the tubes 41, 40, 39 respectively. The bases of transistors 57–59 are supplied via series resistors 62–64 respectively with a voltage of -15 volts from a second voltage source $V_2$ while the collector-grid paths of transistors 57–59 are supplied via series resistors 62–64 respectively with a voltage of -50 volts from a third voltage source $V_3$. The bases of transistors 57–59 are additionally conductively connected to the associated row lines of the keyboard conductor matrix 73.

The circuit thus far described corresponds to that shown in FIG. 1 with the transistors 57–59 corresponding to the amplifiers of FIG. 1. According to the preferred embodiment of FIG. 2, wherein each position of the output device is constituted by a multianode number display tube, additional circuitry must be provided to control the particular anode or anodes of each tube 39–41 which is supplied with a signal, and thus determine the particular number of character which will be displayed, when a control signal is supplied to the associated grid 42–44.

This is accomplished according to the preferred embodiment by providing the integrated circuit 51 (or a separate integrated circuit), in a manner well known in the art with a number control arrangement (not shown) which produces control signals at a plurality of output terminals or lines, e.g. lines 55 and 56. Each of output lines 55 and 56 is connected to the emitter of a further transistor 60 or 61 whose collector is connected to an associated anode 45 of tube 39. Depending on the particular anode or anodes which is to be energized in order to produce the particular numeral to be displayed, the integrated circuit 51 selectively applies appropriate voltage signals, in the illustrated example a signal of 0 volt, to the output lines 55 and 56. The bases of the transistors 60 and 61 are supplied via the respective resistors 65 and 66 with the d.c. voltage of $-15V$ from the second d.c. voltage source $V_2$ while the collector-anode paths of the transistors 60 and 61 are supplied via the respective resistors 70 and 71 with the voltage of $-50$ volts from the third d.c. voltage source $V_3$. It is to be understood that, although not shown, each anode of each of the display tubes is provided with a similar control circuit and that the output data device may include a greater number of display tubes than the three which are illustrated.

In the operation of the embodiment of FIG. 2, if, for example, output line 54 of the integrated circuit has a voltage of 0 volt and line 56 at the anode side is simultaneously set, for example, at 0 volts, the voltage conditions in display tube 39 will cause the number represented by the addressed anode to light up. At the same time however, as a result of the bias conditions in the tube 39, the base of transistor 59 will emit an interrogation signal via row line 72 to the keyboard conductor matrix 73 so that data can be fed into the integrated circuit 51 via the column lines of the conductor matrix 73 in the manner described in connection with FIG. 1. The keyboard contacts 77 are here decoupled from one another by the base-emitter diodes of the transistors 57–59 which are not presently being addressed by the control signal on one of the lines 52–54.

It will be understood that the above description of the present invention is susceptible to various modifications, changes and adaptations, and the same are intended to be comprehended within the meaning and range of equivalents of the appended claims.

What is claimed is:

1. In a circuit arrangement for data processing devices including: an input keyboard having a plurality of keyboard contacts which are disposed at the points of intersection of a conductor matrix; a multiposition data output device; electronic control circuit means having a plurality of outputs, each of which is connected to a separate position of said output device to control same, for sequentially providing a control signal at each of said outputs; means, connected to respective ones of said outputs and responsive to the control signal thereat, for applying an interrogation signal to a respective one of the row lines of said keyboard conductor matrix; and a decoder means connected to the column lines of said keyboard conductor matrix for evaluating the signals received via said column lines as a result of closed keyboard contacts as the input data for the data processing device; the improvement wherein said means for applying an interrogation signal comprises: a plurality of transistors each associated with a separate one of said outputs, each said transistor having its emitter-collector current path connected between the associated said output and the associated said position of said data output device and its base connected to the associated row line of said keyboard conductor matrix.

2. A circuit arrangement as defined in claim 1 wherein said multiposition data output device comprises a plurality of number display tubes, one for each said position, with each said tube including a cathode, a control grid and at least one anode; wherein each of said grids of said tubes is connected via a respective one of said emitter-collector paths of said transistors to a respective one of said outputs of said electronic control means; and further comprising: a first source of d.c. voltage conected to the cathodes of each of said tubes; a second source of d.c. voltage connected to the bases of said transistors and to the row lines of said conductor matrix; a third source of d.c. voltage connected to said grids in parallel with said transistors; and means connected to the anodes of said tubes for selectively applying a d.c. voltage signal to said anodes to cause the associated tube to produce an indication whenever a control signal is applied to the associated said grid.

3. A circuit arrangement as defined in claim 2 wherein: said means for selectively applying a d.c. voltage signal to said anodes includes a plurality of further transistors each having its emitter-collector path connected between a respective one of said anodes and a respective output of a means for selectively producing output signals for controlling said anodes; the bases of said further transistors are connected to said second source of d.c. voltage; and said anodes are connected to said third source of d.c. voltage.

4. A circuit arrangement as defined in claim 3 wherein each of said tubes includes a plurality of anodes each connected to one of said further transistors.

5. A circuit arrangement as defined in claim 1 wherein: each of said transistors is a single stage amplifier, having a common base configuration, for the associated control signal.

* * * * *